(12) United States Patent
Nishimura

(10) Patent No.: US 6,172,903 B1
(45) Date of Patent: Jan. 9, 2001

(54) HYBRID DEVICE, MEMORY APPARATUS USING SUCH HYBRID DEVICES AND INFORMATION READING METHOD

(75) Inventor: Naoki Nishimura, Tokyo (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/401,795

(22) Filed: Sep. 22, 1999

(30) Foreign Application Priority Data

Sep. 22, 1998 (JP) .................................................. 10-268373
Feb. 15, 1999 (JP) .................................................. 11-036380

(51) Int. Cl.$^7$ .................................................. G11C 11/00
(52) U.S. Cl. .......................................... 365/158; 365/171
(58) Field of Search .................................. 365/158, 171, 365/157; 360/66

(56) References Cited

U.S. PATENT DOCUMENTS 5,946,227 * 8/1999 Naji ....................................... 365/158
6,111,715 * 8/2000 Tsuchiya ................................ 360/66

FOREIGN PATENT DOCUMENTS 6-084347   3/1994   (JP) .

* cited by examiner

Primary Examiner—A. Zarabian
(74) Attorney, Agent, or Firm—Fitzpatrick, Cella, Harper & Scinto

(57) ABSTRACT

A hybrid device includes a magnetoresistance (MR) element, a resistor connected in series to an end of the MR element, and a field effect transistor (FET) having its gate electrode connected to the connection point of the MR element and the resistor. The hybrid device constitutes an essential part of a memory apparatus, in which the other end of the MR element and the drain electrode of the FET are grounded, a voltage source is provided for applying a predetermined voltage to the MR element, and a second voltage source or a current source is provided for flowing a drain current in the FET. The memory apparatus can record information by utilizing two different states of the resistance of the MR element. The FET functions both as an switching element for writing/reading information and an amplifying element for boosting the resistance difference. The memory apparatus may comprise a plurality of hybrid devices wired so as to form an XY-matrix pattern.

11 Claims, 13 Drawing Sheets

"1"

"0"

"1"

"0"

HYBRID DEVICE, MEMORY APPARATUS USING SUCH HYBRID DEVICES AND INFORMATION READING METHOD

BACKGROUND OF THE INVENTION

1. Field of the Invention

This invention relates to a hybrid device and a memory apparatus realized by using such hybrid devices. It also relates to an information reading method.

2. Related Background Art

Various devices utilizing the magnetoresistance effect such as thin film magnetic heads have been developed in recent years. In the course of developing such devices, magnetic thin film memories using magnetoresistance elements that can replace currently popular DRAMs and EEPROMs have been proposed. Since the electric resistance of a magnetoresistance element varies remarkably depending on its state of magnetization, non-volatile solid-state memories can be realized by combining such elements and semiconductor elements in a manner referred to as hybridization.

For instance, Japanese Patent Application Laid-Open No. 6-84347 describes a magnetic thin film memory comprising memory cells that are formed by combining magnetoresistance elements and switching elements such as field effect transistors (hereinafter referred to as FETs). FIG. 1 of the accompanying drawings schematically illustrates the circuit configuration of a magnetic thin film memory proposed in the above cited patent document.

FIG. 1 is a schematic circuit diagram of a known memory apparatus realized by using known memory devices (hybrid devices of magnetic thin film elements/semiconductor elements). FIGS. 2A and 2B illustrate two different arrangements of magnetic thin films in a memory device as shown in FIG. 1. FIGS. 3A and 3B illustrate two different states of magnetization of a magnetoresistance element as shown in FIG. 1.

Referring to FIG. 1, the memory apparatus comprises a plurality of memory cells, each having a magnetoresistance element 1 for storing information as a function of the state of magnetization of the magnetic material of the element and a switching element 2 for recording/reproducing information. Typically, FETs are used for the switching elements 2 and a write line 5 is connected to the source electrode of each of the FETs. Each of the magnetoresistance elements 1 is connected at an end thereof directly to the write line 5 of the device and the other end to the ground potential.

The memory apparatus additionally comprises a plurality of selection lines 4 for applying a voltage to each of the switching elements 2 to turn it on or off and a plurality of data lines 3 for writing data to or reading data from each of the memory cells, said selection lines 4 and said data lines 3 being arranged to form a grid. Memory cells are arranged at the respective intersections of the selection lines 4 and the data lines 3. The gate electrodes of the FETs of the memory cells of each row are commonly connected to the related selection line 4, whereas the drain electrodes of the FETs of the memory cells of each column are commonly connected to the related data line 3. A resistor 6 is connected to each of the data lines 3 so that information is recorded in each of the memory cells by applying a predetermined voltage to the related data line 3 by way of the related resistor 6.

In FIG. 1, the magnetoresistance elements 1 are discriminated from each other by means of reference symbols 1aa through 1ac and 1ba through 1bc, whereas the switching elements 2 are discriminated from each other by means of reference symbols 2aa through 2ac and 2ba through 2bc. Similarly, the write lines 5 are identified by respective reference symbols 5aa through 5ac and 5ba through 5bc, whereas the data lines 3 are identified by respective reference symbols 3a through 3c and the selection lines 4 are discriminated from each other by means of reference symbols 4a and 4b.

As seen from FIGS. 2A and 2B, a magnetoresistance element 1 is formed from a giant magnetoresistance (GMR) film obtained by laying a magnetic layer 20 showing a large coercive force and a magnetic layer 21 showing a small coercive force repeatedly for several times with a non-magnetic layer 22 interposed therebetween to produce a multilayer structure. A GMR film has a remarkable property that it shows a small electric resistance when both the magnetic layers showing a large coercive force and the magnetic layers showing a small coercive force are magnetized in a same direction whereas it shows a large electric resistance when the magnetic layers showing a large coercive force and the magnetic layers showing a small coercive force are magnetized in opposite directions.

Now, a method of recording information to and reproducing information from a memory apparatus as shown in FIG. 1 will be discussed below.

When storing "1" in the magnetoresistance element 1ac, a voltage of $+V_3$ is typically applied to the data line 3c. When a voltage $V_4$ is applied to the selection line 4a under this condition, the switching element 2ac is turned on and a relatively large electric current $I_1$ flows to the magnetoresistance element 1ac and the write line 5ac in a direction running from the bottom surface to the top surface of FIG. 3A. Then, a magnetic field $H_1$ is applied to the magnetoresistance element 1ac due to the electric current $I_1$ so that consequently the direction of magnetization of the magnetic layer b operating for storing information and showing a small coercive force is made to agree with the direction of the magnetic field $H_1$, or the leftward direction in FIG. 3A.

When, on the other hand, storing "0" in the magnetoresistance element 1ac, a voltage of $-V_3$ is typically applied to the data line 3c. When a voltage $V'_4$ is applied to the selection line 4a under this condition, the switching element 2ac is turned on and a relatively large electric current $I_0$ flows to the magnetoresistance element 1ac and the write line 5ac in a direction running from the top surface to the bottom surface of FIG. 3B. Then, a magnetic field $H_0$ is applied to the magnetoresistance element 1ac due to the electric current $I_0$ so that consequently the direction of magnetization of the magnetic layer b operating for storing information and showing a small coercive force is made to agree with the direction of the magnetic field $H_0$, or the rightward direction in FIG. 3B.

Since the switching element 2ac is turned on only when a predetermined voltage is applied to the related selection line 4a, no electric current will flow to the magnetoresistance element 1bc commonly connected to data line 3c with the magnetoresistance element 1ac. Additionally, since no electric current flows to the data lines 3 except the data line 3c to which a predetermined voltage is applied, no electric current will flow to the magnetoresistance elements 1aa, 1ab commonly connected to selection line 4a with the magnetoresistance element 1ac.

The magnetic layer 20 showing a large coercive force is normally magnetized in the rightward direction in FIGS. 2A and 2B and, therefore, the resistance of the magnetoresistance element 1ac is relatively large when "1" is stored in it but relatively small when "0" is stored in it.

When reproducing the information stored in the magnetoresistance element 1ac, a constant electric current $I_3$ is made to flow through the data line 3c for data reproduction and an appropriate voltage is applied to the selection line 4a to turn on the switching element 2ac. Then, an electric current flows to the write line 5ac and the magnetoresistance element 1ac as a result. Therefore, a potential difference $V_{\alpha\beta}$ will be produced between point α (the drain voltage of the switching element 2ac) and point β (ground potential).

As pointed out above, the electric resistance of the magnetoresistance element 1ac varies depending on the state of magnetization so that consequently the value of the potential difference $V_{\alpha\beta}$ also varies. Therefore, the state of magnetization of the magnetoresistance element 1ac and hence the information stored there can be known by observing the potential difference $V_{\alpha\beta}$.

Thus, in the above described known memory devices (hybrid devices of magnetic thin film elements/semiconductor elements), the information stored in a memory cell can be identified by detecting the voltage difference produced as a function of the change in the resistance of the magnetoresistance element connected to the source electrode or the drain electrode of the switching element (e.g., FET) of the memory cell.

However, since the voltage difference is proportional to the product $I \cdot \Delta R$ of the drain current I and the difference of resistance $\Delta R$ of the magnetoresistance element, it is difficult to obtain a voltage difference required for identifying the stored information if the difference of resistance $\Delta R$ of the magnetoresistance element is small.

Additionally, with a magnetoresistance element showing a small difference of resistance $\Delta R$, while a large drain current will be required to produce a voltage difference necessary for identifying the stored information, a large drain current entails a problem of a large power consumption of the magnetic thin film memory device.

Still additionally, even a magnetoresistance element showing a relatively large difference of resistance $\Delta R$ requires the use of a sense circuit for amplifying the difference of resistance because the potential difference produced by the difference of resistance is small. Then, there arises a problem of complex circuit configuration.

In an experiment, a memory cell as shown in FIG. 4 was used and a constant current source $I_1$ was connected to the drain electrode of the FET. Then, the voltage $V_{AB}$ between the drain electrode (point A) and the ground potential (point B) was observed by varying the electric current being supplied to the drain electrode. The output voltage of constant voltage source $V_1$ was invariably held to 5V.

FIGS. 5 and 6 show some of the obtained results. FIG. 5 is a graph showing the relationship between the output current I of the constant current source and the voltage $V_{AB}$ when a magnetoresistance element comprising a spin scattering film adapted to show two resistance values of 10 Ω and 11 Ω (with a ratio of change of resistance of 10%) and hence operates as binary element.

FIG. 6 is a graph showing the relationship between the output current I of the constant current source and the voltage $V_{AB}$ when a magnetoresistance element comprising a spin tunnelling film adapted to show two resistance values of 4.0 KΩ and 4.8KΩ (with a ratio of change of resistance of 20%) and hence also operates as binary element.

As seen from FIG. 5, with the magnetoresistance element comprising a spin scattering film, the voltage difference observed for the voltage $V_{AB}$ due to the difference of resistance of the magnetoresistance element was 3 mV when the output current I of the constant current source was 3 mA. It was difficult to reliably detect such a low voltage within a memory and hence an amplifier circuit was required to boost the detected voltage to a voltage level of several volts before outputting it to the outside of the memory.

With the magnetoresistance element comprising a spin tunnelling film as shown in FIG. 6, the voltage difference observed for the voltage $V_{AB}$ due to the difference of resistance of the magnetoresistance element was $\Delta R \times I = 0.8$ KΩ×0.689 mA=551 mV when the output current I of the constant current source was 0.689 mA. Therefore a sense circuit was required to boost the detected voltage to a voltage level of several volts before outputting it to the outside of the memory.

When the output current I of the constant current source was raised to 0.690 mA, the voltage between the gate and the source was 5V−(0.690 mA×4.8 KΩ)=1.688V because of the rise in the source voltage. Since this value was equal to the threshold voltage of the FET, the latter was not turned on and no electric current was observed between the source and the drain. In other words, the output current I of the constant current source could not be raised above 0.690 mA. Then, it was impossible to reliably detect the information stored in the memory by raising the electric current flowing to the drain. This is because, in the arrangement of FIG. 1, the FETs are used only as switching elements and are not adapted to operate as amplifiers.

Additionally, when storing information in the above described memory device by generating a magnetic field by means of the write line arranged adjacent to the magnetoresistance film of a selected magnetoresistance element, the electric current made to flow for storing information in the element also flows to the magnetoresistance film because a same and identical current path is used both for observing the resistance of the magnetoresistance film and for recording information. Then, only an insufficient electric current flows through the write line to make it impossible to efficiently generate a magnetic field from the write line and record information on a reliable basis.

SUMMARY OF THE INVENTION

In view of the above identified technological problems of the prior art, it is therefore an object of the present invention to provide a hybrid device containing a magnetic thin film element and a semiconductor element that can store information and reproduce the stored information on a reliable basis with a simple circuit configuration and is adapted for a high degree of integration and also provide a memory apparatus comprising such hybrid devices.

Another object of the present invention is to provide a highly sensitive hybrid device that can reliable store information and reproduce the stored information and also provide a memory apparatus comprising such hybrid devices.

According to an aspect of the invention, the above objects are achieved by providing a hybrid device comprising:

a magnetoresistance element;

a resistor connected in series to an end of said magnetoresistance element; and a field effect transistor having its gate electrode connected to the contact point of said magnetoresistance element and said resistor.

According to another aspect of the invention, there is provided a memory apparatus comprising:

a hybrid device according to the invention as defined above, the other end of the magnetoresistance element and the drain electrode of the field effect transistor of the hybrid device being grounded;

a first voltage source for applying a predetermined voltage to the magnetoresistance element by way of the resistor; and a second voltage source for applying a constant voltage between the source electrode and the drain electrode of said field effect transistor.

According to still another aspect of the invention, there is provided a memory apparatus comprising:

a hybrid device according to the invention as defined above, the other end of the magnetoresistance element and the drain electrode of the field effect transistor of the hybrid device being grounded;

a voltage source for applying a predetermined voltage to the magnetoresistance element by way of the resistor; and a current source for flowing a constant electric current between the source electrode and the drain electrode of said field effect transistor.

According to still another aspect of the invention, there is provided a memory apparatus comprising:

a plurality of hybrid devices according to the invention as defined above and arranged to form a matrix, the other end of the magnetoresistance element and the drain electrode of the field effect transistor of each of the hybrid devices being grounded;

a plurality of selection lines, each connecting the resistors of the hybrid devices of a same row;

a first voltage source for selectively applying a predetermined voltage to the magnetoresistance element of a desired hybrid device by way of the related selection line;

a plurality of data lines, each connecting the source electrodes of the field effect transistors of the hybrid devices of a same column for reading information from a desired hybrid device; and a second voltage source for selectively applying a voltage to the field effect transistor of the desired hybrid device by way of the related data line.

According to a further aspect of the invention, there is provided a method for reading the information stored in a specific hybrid device of a memory apparatus according to the invention as defined above, said method comprising steps of:

selectively applying a constant voltage to the selection line connected to the resistor of the specific hybrid device by means of said first voltage source;

selectively applying a constant voltage to the data line connected to the source electrode of the field effect transistor of the specific hybrid device by means of said second voltage source; and reading the information stored in the specific hybrid device by detecting the on/off state of the field effect transistor of the specific hybrid device by way of the data line subjected to said voltage.

DESCRIPTION OF THE PREFERRED EMBODIMENTS

Now, the present invention will be described by referring to the accompanying drawings that illustrate preferred embodiments of the invention.

First Embodiment

Figure 7:
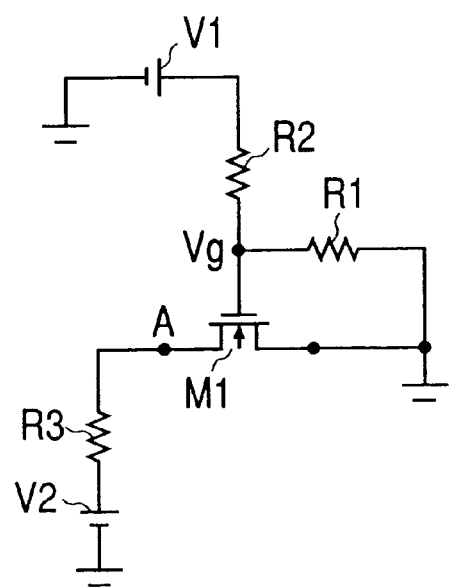
FIG. 7 is a schematic circuit diagram of a first embodiment of hybrid device according to the invention.

FIG. 7 is a schematic circuit diagram of a first embodiment of memory device (hybrid device of a magnetic thin film element/a semiconductor element) according to the invention.

Referring to FIG. 7, the embodiment of hybrid device comprises a constant voltage source V1, a magnetoresistance element R1 and a resistor R2 connected between the constant voltage source and the ground potential GND, a MOS (metal/oxide/semiconductor) type field effect transistor (to be referred to as MOSFET hereinafter) M1 of which gate electrode is connected to the connection point of the magnetoresistance device R1 and the resistor R2, another resistor R3 operating as load to the MOSFET M1 and another constant voltage source V2 for applying a predetermined DC voltage to the drain electrode of the MOSFET M1. The source electrode of the MOSFET M1 is connected to the ground potential GND.

The magnetoresistance element R1 is typically made of AMR (anisotropic magnetoresistance) film or GMR film and shows a resistance value that varies depending on its state of magnetization. Unlike the magnetoresistance element R1, the resistors R2 and R3 are elements having respective constant resistance values.

A magnetoresistance element made of AMR film shows a resistance that varies depending on the angle between the direction of the electric current flowing through the magnetic film, typically made of NiFe or Co, and the direction of magnetization. A magnetoresistance element made of GMR film, on the other hand, has a configuration of sandwiching a non-magnetic film by means of a pair of magnetic films showing different coercive forces and shows a resistance that varies depending on the directions of magnetization of the two magnetic films.

A gate voltage Vg defined by formula (1) below is applied to the gate electrode of the MOSFET M1 of the embodiment illustrated in FIG. 7 and having the above described configuration:

$$Vg = (r1/(r1+r2))E1 \quad (1)$$

where r1 is the resistance of the magnetoresistance element R1, r2 is the resistance of the resistor R2 and E1 is the output voltage of the constant voltage source V1.

The resistance of the magnetoresistance element R1 takes either of two different values of r1min and r1max (r1min<r2max) depending on its state of magnetization. If the gate voltage of the MOSFET M1 is expressed by Vg1 when the resistance is equal to r1min and by Vg2 when the resistance is equal to r1max, then Vg1 and Vg2 are defined by formulas (2) and (3) below respectively:

$$Vg1 = (r1min/(r1min+r2))E1 \quad (2)$$

$$Vg2 = (r1max/(r1max+r2))E1 \quad (3)$$

Then, if the values of r1 and r2 are so selected that the threshold voltage Vth of the MOSFET M1 is found between Vg1 and Vg2, or $$Vg1 < Vth < Vg2 \quad (4)$$

the MOSFET M1 is turned off to allow no electric current to flow between the source and drain of the MOSFET M1 when the resistance of the magnetoresistance element R1 is equal to r1min, whereas the MOSFET M1 is turned on to allow an electric current to flow between the source and the drain of the MOSFET M1 when the resistance of the magnetoresistance element R1 is equal to r1max.

Thus, the state of magnetization of the magnetoresistance element R1 can be detected by observing the potential difference between the drain electrode of the MOSFET M1 and the ground potential or the drain current of the MOSFET M1.

In other words, with the above embodiment, the state of magnetization of the magnetoresistance element R1 can be detected reliably and accurately by observing the on/off state of the MOSFET M1.

For instance, a highly sensitive magnetic field sensor can be realized if this embodiment of hybrid device is used for a magnetic field sensor of a hard disk. Similarly, a solid-state memory that allows a sensitive detection of the stored information can be realized if this embodiment of hybrid device is used for a memory cell of a magnetic thin film memory.

It should be noted that the above described effect of the embodiment is not limited to the circuit configuration of FIG. 7. For instance, the MOSFET may be replaced by a junction type field effect transistor (JFET), a MES (metal semiconductor) type field effect transistor (MESFET), or a MIS (metal insulator semiconductor) type field effect transistor (MISFET) comprising an insulator other than oxide film, although the use of a MOSFET is most desirable from the viewpoint of fine processability and stable controllability.

The other end of the magnetoresistance element R1 may be connected to the constant voltage source instead of the ground potential. The constant voltage sources V1 and V2 may be arranged externally relative to the hybrid device.

Additionally, the magnetoresistance element R1 and the resistor R2 of the hybrid device of FIG. 7 are interchangeable. In other words, R1 and R2 may represent a resistor and a magnetoresistance element respectively.

While a constant voltage is applied to the drain of the MOSFET M1 by way of the resistor R3 and the change, if any, in the resistance of the magnetoresistance element R1 is detected by observing the electric potential of the drain electrode of the MOSFET M1 in the above description, a sense circuit may be used to further amplify the drain current or the electric potential of the drain electrode may be observed by connecting a constant current source to the drain electrode for the purpose of the invention.

Second Embodiment

Now, a second embodiment of the present invention will be described by referring to the accompanying drawings.

This embodiment is realized by annexing an information recording means adapted to electrically or electromagnetically changing the resistance of the magnetoresistance element to the hybrid device of the first embodiment. By arranging such an information recording means, the stored information can be detected with an enhanced degree of sensitivity so that it is possible to prepare a memory cell adapted to a high degree of integration.

Figure 8A:
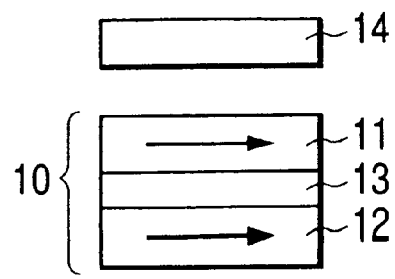
FIGS. 8A and 8B are schematic cross sectional views of the magnetoresistance element of a second embodiment of hybrid device according to the invention.
Figure 8B:
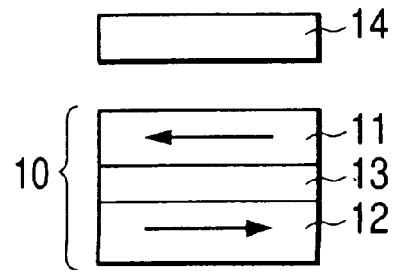

FIGS. 8A and 8B schematically illustrate an information recording means that can be used for storing information in the magnetoresistance element of the first embodiment.

Referring to FIGS. 8A and 8B, the information recording means comprises a write line 14 arranged near the magnetoresistance element 10. A voltage source or a current source is connected to the write line 14 in order to make an electric current flow through the write line 14. In the instance of FIGS. 8A and 8B, the magnetoresistance element 10 is made of GMR film comprising a first magnetic layer 11 showing a small coercive force, a second magnetic layer 12 showing a coercive force greater than that of the first magnetic layer 11 and a non-magnetic layer 13 sandwiched by the first and second magnetic layers.

With the above described arrangement, information is stored in the magnetoresistance element 10 by causing an electric current to flow through the write line 14. As an electric current flows through the write line 14, a magnetic field is generated there with a magnitude that is proportional to the intensity of the electric current of the write line 14 to consequently magnetize the magnetic layers of the magnetoresistance element. The direction of the magnetic field will be changed by changing the direction of the flow of the write current. Therefore, the direction of the magnetization of the magnetoresistance element 10 can be changed according to the information to be stored there.

For instance, if an electric current is made to flow through the write line 14 from the bottom surface to the top surface of the FIGS. 8A and 8B, the magnetoresistance element 10 will be magnetized in the rightward direction. If, on the other hand, an electric current is made to flow through the write line 14 from the top surface to the bottom surface of FIGS. 8A and 8B, the magnetoresistance element 10 will be magnetized in the leftward direction.

The magnitude of the magnetic field generated by the write current is made to be greater than the coercive force of the magnetic layer (memory layer) of the magnetoresistance element 10 for storing information. If, for instance, the first magnetic layer 11 is used as memory layer and the second magnetic layer 12 is used as pin layer that shows a coercive force greater than the first magnetic layer 11 and is magnetized in advance in a predetermined direction, digital information of "0" or "1" can be stored in the first magnetic layer 11 by appropriately selecting the direction of magnetization thereof, as seen in FIGS. 8A and 8B.

An insulation film is preferably arranged between the magnetoresistance element 10 and the write line 14 in order to improve the efficiency of magnetic field generation of the write line 14. While only a single write line 14 is used in the instance of FIGS. 8A and 8B, two or more than two write lines may alternatively be arranged so that a synthetic magnetic field may be generated with an enhanced level of intensity or a specific magnetoresistance element may be selected from among a plurality of magnetoresistance elements commonly connected to a same selection line for storing information.

The information stored in the magnetoresistance element 10 can be read out with an enhanced level of sensitivity because the resistance accurately reflects the recorded information if the magnetoresistance element 10 is made into a configuration same as that of the first embodiment. Additionally, since the voltage of the constant voltage source V2 is directly output to the drain electrode of the MOSFET, the circuit does not require the use of a sense circuit for amplification. The net result will be a simple circuit configuration, a reduced cost and an increased memory capacity per chip leading to a higher degree of integration.

Additionally, once the magnetic film of the magnetoresistance element 10 is magnetized, it maintains the orientation of magnetization. Therefore, a magnetic thin film hybrid device can be used as non-volatile hybrid device.

While the magnetoresistance element 10 of the above embodiment has a memory layer/pin layer configuration, it may alternatively be made to have a detection layer/memory layer configuration, the layer having a smaller coercive force operating as detection layer while a layer having a greater coercive force operating as memory layer. In this instance, information is stored in the memory layer, and the stored information is read out by producing two magnetization states by reversing the magnetization of the detection layer.

Third Embodiment

Now, a third embodiment of the invention will be described by referring to the accompanying drawings.

This embodiment is a memory apparatus comprising hybrid devices having a configuration as shown in FIG. 7.

Figure 9:
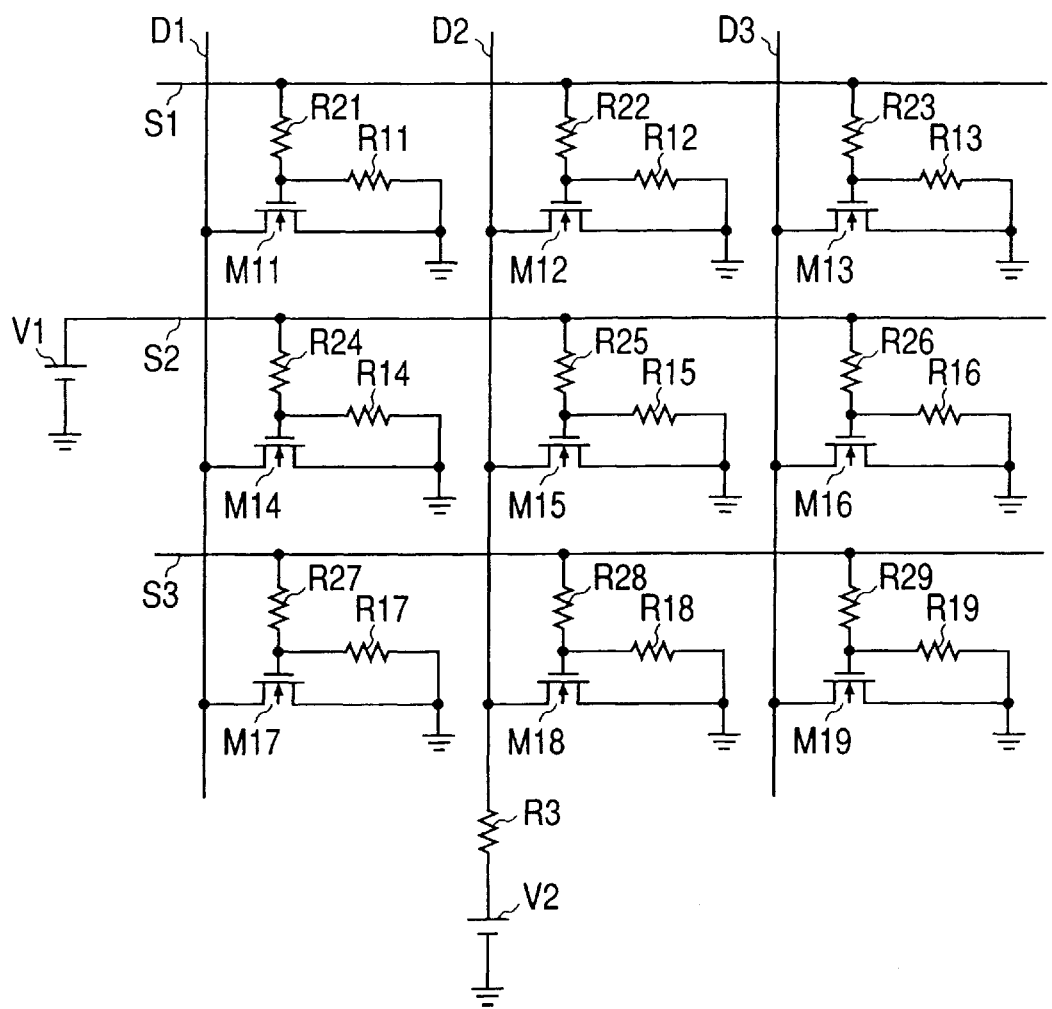
FIG. 9 is a schematic circuit diagram of a memory apparatus according to the invention and comprising memory cells as shown in FIG. 7, illustrating a third embodiment of the invention.

FIG. 9 is a circuit diagram of the embodiment of memory apparatus comprising hybrid devices having a configuration as shown in FIG. 7.

Referring to FIG. 9, this embodiment of memory apparatus comprises a large number of memory cells having respective hybrid devices with a configuration as shown in FIG. 7 and arranged to form a matrix.

The gate electrodes of the MOSFETs of the memory cells of each row are connected to a common selection line S arranged horizontally in FIG. 9, whereas the drain electrodes of the MOSFETs of the memory cells of each column are connected to a common data line D arranged vertically in FIG. 9.

It will be appreciated that, in FIG. 9, the magnetoresistance elements are denoted respectively by reference symbols R11 through R19, whereas the MOSFETs are denoted respectively by reference symboles M11 through M19. Similarly, the data lines are denoted respectively by reference symbols D1 through D3, whereas the selection lines are denoted respectively by reference symbols S1 through S3.

For retrieving the information stored in a specific memory cell, e.g., the magnetoresistance element R15, of a memory apparatus having a configuration as described above, output voltages E1 and E2 of constant voltage sources V1 and V2 are applied respectively to the selection line S2 and the data line D2 of the memory cell comprising the magnetoresistance element R15. Then, no magnetoresistance element other than the magnetoresistance element R15 will be selected so that only the information stored in the magnetoresistance element R15 can be retrieved.

With a memory apparatus having a configuration as described above, the MOSFET of the selected memory cell amplifies the signal for detecting the state of magnetization of the corresponding magnetoresistance element and is also used to select the specific element out of the large number of magnetoresistance elements.

Fourth Embodiment

Now, a fourth embodiment of the invention will be described by referring to the accompanying drawings.

As described above by referring to the first embodiment, when using memory cells as shown in FIG. 7 for a memory apparatus, the magnetoresistance elements there of are typically made of AMR film or GMR film.

The resistance value of a magnetoresistance element made of AMR film varies depending on the electric current that is made to flow through the magnetic film thereof as the electric current is made to flow either perpendicularly relative to the direction of magnetization of the magnetic film or in parallel with the direction of magnetization of the magnetic film. The ratio of change of resistance as defined by (r1max−r1min)/r1min is between 2 and 3% (r1min<r1max: r1min and r1max being the resistance values that the magnetoresistance R1 can take).

On the other hand, two types of magnetoresistance elements made of GMR film are known, the spin tunnelling type and the spin scattering type. The absolute value of the resistance of a magnetoresistance element made of GMR film varies depending on the type of the element.

A magnetoresistance element of the spin scattering type shows a resistance level of about 20 $\Omega$ and a ratio of change of resistance of about 5 to 10% due to the direction of magnetization. On the other hand, a magnetoresistance element of the spin tunnelling type shows a resistance level of about several kiloohms and a ratio of change of resistance of about 10 to 30%.

Therefore, for the purpose of the present invention, a magnetoresistance element is preferably made of GMR film that shows a large ratio of change of electric resistance in order to effectively detect the change in the resistance of the magnetoresistance element.

Now, a spin scattering type magnetoresistance element and a spin tunnelling type magnetoresistance element will be described below.

As described above, a GMR film comprises a pair of magnetic layers with different respective coercive force levels and a non-magnetic layer sandwiched by the two magnetic layers. Thus, one of the magnetic layers shows a relatively high level of coercive force, whereas the other magnetic layer shows a relatively low level of coercive force. In the following description, the magnetic layer with a lower coercive force level is referred to as first magnetic layer, whereas the magnetic layer with a higher coercive force level is referred to as second magnetic layer.

Firstly, a spin scattering type magnetoresistance element will be discussed.

In a spin scattering type magnetoresistance element, the non-magnetic layer is preferably made of an electrically conductive material containing Cu as principal ingredient and showing an electric conductivity higher than both the first and second magnetic layers. Then, the Fermi level of the nonmagnetic layer is found close to both that of the first magnetic layer and that of the second magnetic layer and adheres well to the magnetic layers. Therefore, the use of such a non-magnetic layer is advantageous to obtain a large change of electric resistance because it can easily give rise to a large electric resistance at the interfaces thereof when the direction of magnetization is changed. The non-magnetic layer preferably has a film thickness greater than 5 angstroms and smaller than 60 angstroms.

The first and second magnetic layers are preferably made of an amorphous alloy containing Ni, Fe and Co or Co and Fe as principal ingredients. Examples of such alloys include NiFe, NiFeCo, FeCo and CoFeB.

If NiFe is used with a composition of $Ni_xFe_{100-x}$, x is preferably between 35 and 86. If, on the other hand, NiFeCo is used with a composition of $Ni_x(Fe_{100-y}Co_y)_{100-x}$, x is preferably between 10 and 70, while y is preferably between 30 and 90, more preferably between 60 and 85. An amorphous magnetic material such as CoFeB with a composition of $Co_{84}Fe_9B_7$ or $Co_{72}Fe_8B_{20}$ may also be used for the first and second magnetic layers.

The thickness of the first magnetic layer and that of the second magnetic layer should be selected to realize an efficient change in the resistance value. More specifically, the thickness of the first magnetic layer is preferably less than 200 angstroms, more preferably less than 150 angstroms. If the thickness of significantly greater than the mean free path of electrons, the magnetoresistance effect of the layer can be reduced due to the phenomenon of phonon scattering.

However, if the thickness of the first magnetic layer is too small, the resistance value will become too low to obtain a sufficiently large signal output and maintain the magnetization effect. Therefore, it is preferably more than 20 angstroms, more preferably more than 80 angstroms.

Now, a spin tunnelling type magnetoresistance element will be discussed below.

A spin tunnelling type magnetoresistance element comprises a non-magnetic layer that is a thin insulation film. Then, an electric current is made to flow in a direction perpendicular to the surface of the film to give rise to a tunnelling effect of electrons from the first magnetic layer to the second magnetic layer. The non-magnetic layer is typically made of aluminum oxide $AlO_x$, aluminum nitride $AlN_x$, silicon oxide $SiO_x$ or silicon nitride $SiN_x$. The non-magnetic layer may be made of an insulation film either entirely or partly. For example, it may be prepared by oxidizing part of an Al film to produce an $Al_2O_3$ layer therein in the air.

Preferably, the non-magnetic layer is a uniform layer with a thickness of about tens of several angstroms and the insulation film portion thereof has a thickness between 5 angstroms and 30 angstroms. If the thickness of the insulation film layer is less than 5 angstroms, the first and second magnetic layers can become electrically short-circuited. If, on the other hand, the thickness of the insulation film layer is more than 30 angstroms, the tunnelling effect of electrons will occcur with difficulty.

For the purpose of the invention, the thickness of the insulation film layer is more preferably between 5 angstroms and 25 angstroms, most preferably between 5 angstroms and 18 angstroms.

Preferably, both the first and second magnetic layers are preferably made of a magnetic material showing a high spin polarization ratio. To be more specific, it is preferable to select Fe as the first ingredient because it shows a large extent of polarization for a vertical spin on the Fermi plane and then Co as the second ingredient. Thus, the first and second magnetic layers are preferably made of a material containing Fe, Co and Ni as principal ingredient. Examples of magnetic materials that can preferably be used for the first and second magnetic layers include Fe, Co, FeCo, NiFe and NiFeCo.

If NiFe is used with a composition of $Ni_xFe_{100-x}$, x is preferably between 0 and 82. Specific examples of materials that can be used for the first and second magnetic layers include Fe, Co, $Ni_{82}Fe_{20}$, $Ni_{72}Fe_{28}$, $Ni_{51}Fe_{49}$, $Ni_{42}Fe_{58}$, $Ni_{25}Fe_{75}$ and $Ni_9Fe_{91}$.

Preferably, the thickness of the first magnetic layer and that of the second magnetic layer is between 100 angstroms and 5,000 angstroms.

If NiFe, NiFeCo or Fe is used for the first magnetic layer of a spin scattering type magnetoresistance element or a spin tunnelling type magnetoresistance element according to the invention, the Co content is preferably less than that of the second magnetic layer in order to reduce its coercive force. For the same token, the second magnetic layer preferably contains Co as principal ingredient in order to raise its coercive force.

The coercive force of the first magnetic layer may be differentiated from that of the second magnetic layer by making its thickness smaller than that of the second magnetic layer. Alternatively, the second magnetic layer may be made to show a large coercive force by arranging a film of an anti-ferromagnetic material such as FeMn, IrMn or NiO therein.

The coercive force of a magnetoresistance element of the "memory layer/pin layer" type as described above by referring to the second embodiment is preferably between 5 Oe and 50 Oe for the first magnetic layer and between 50 Oe and 10 KOe for the second magnetic layer. In the case of a magnetoresistance element of the "detection layer/memory layer" type, on the other hand, the coercive force is preferably between 5 Oe and 20 Oe for the first magnetic layer and between 10 Oe and 50 Oe for the second magnetic layer and the difference between the coercive force of the first magnetic layer and that of the second magnetic layer is preferably not less than 5 Oe.

Fifth Embodiment

Now, a fifth embodiment of the invention will be described by referring to the accompanying drawings.

Figure 10:
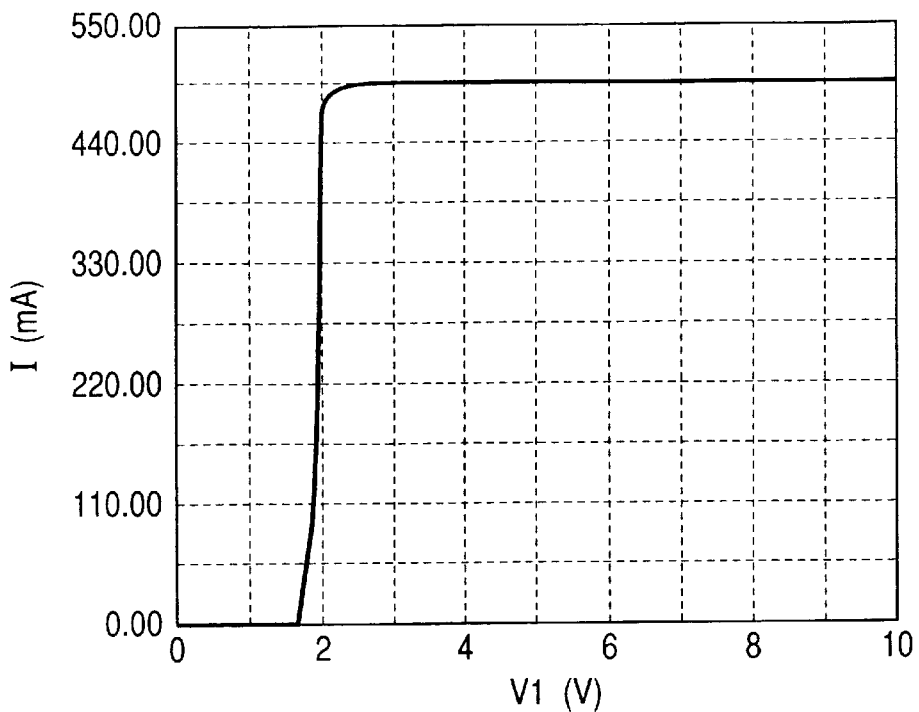
FIG. 10 is a graph showing the relationship between the gate-source voltage and the drain current of the field effect transistor of a fifth embodiment of the invention.
Figure 11:
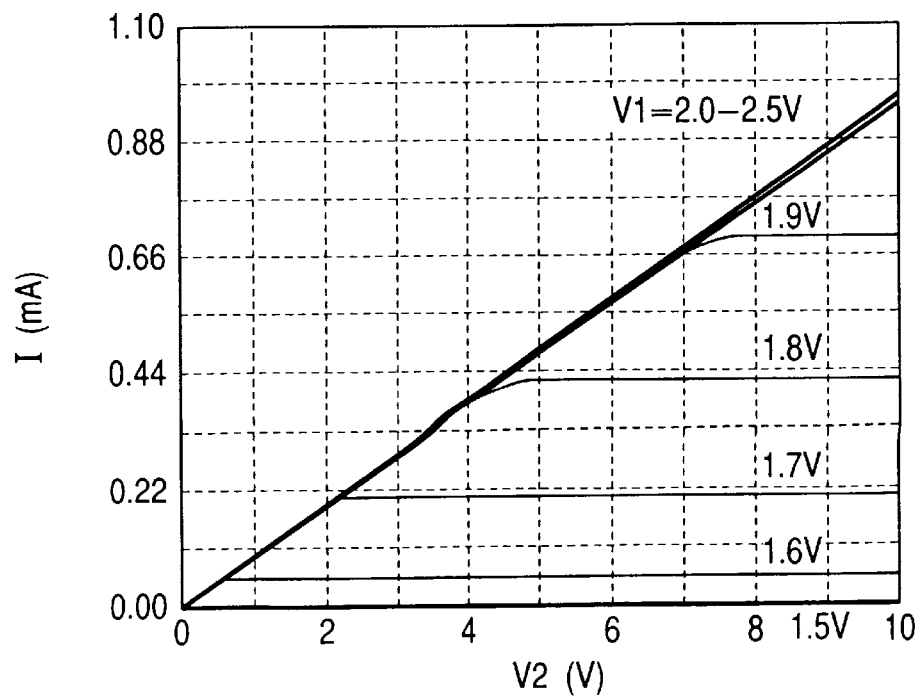
FIG. 11 is a graph showing the relationship between the drain-source voltage and the drain current of the field effect transistor of a fifth embodiment of the invention.

FIG. 10 is a graph showing the relationship between the gate-source voltage and the drain current of the MOSFET of the fifth embodiment and FIG. 11 is a graph showing the relationship between the drain-source voltage and the drain current of the MOSFET of the fifth embodiment obtained in an experiment. Referring to FIG. 11, the gate-source voltage was made to vary stepwise from 1.5V to 1.9V with steps of 0.1V. The threshold voltage Vth of the MOSFET was 1.69V.

A hybrid device as shown in FIG. 7 was prepared by using a MOSFET that operated like the one used for the above experiment and the performance of the hybrid device was observed. The magnetoresistance element R1 was of the spin scattering type that had a configuration of NiFe (10 nm)/Cu (5 nm)/Co (10 nm) layers and showed two different resistance values of 10 Ω and 11 Ω (with a ratio of change of resistance=10%). An aluminum made write line was connected to the magnetoresistance element R1 by way of an SiN film and the device was subjected to a binary recording operation in a manner as shown in FIGS. 8A and 8B. The resistance value of the resistor R2 was 20 Ω.

Figure 12:
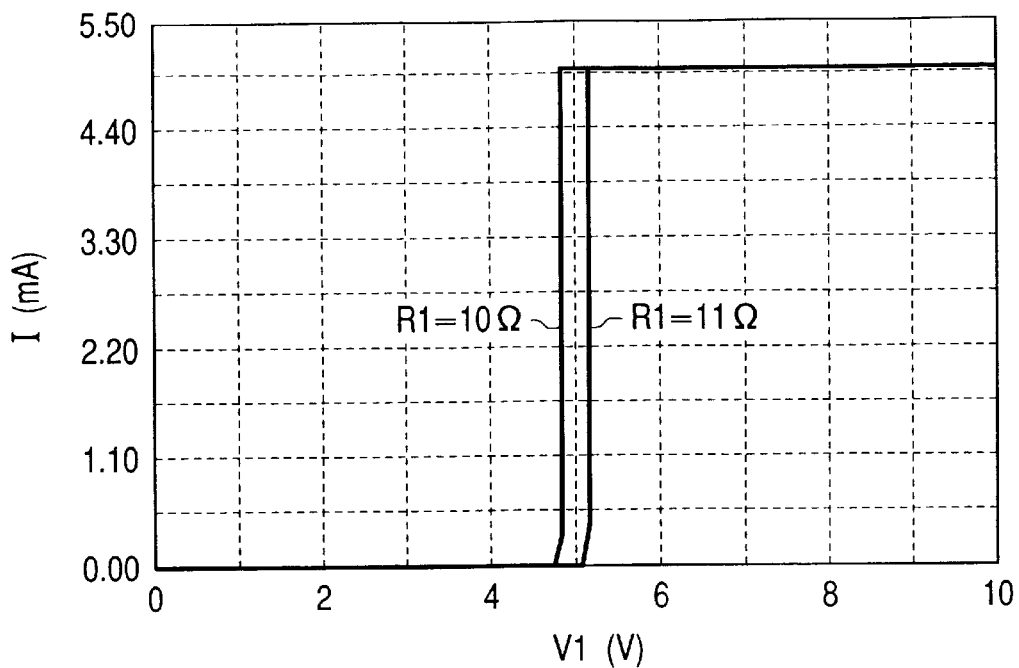
FIG. 12 is a graph showing the relationship between the output voltage of the constant voltage source V1 and the drain current of the hybrid device of FIG. 7.

FIG. 12 is a graph showing the relationship between the output voltage of the constant voltage source V1 and the drain current I of the hybrid device of FIG. 7. Note that the graph of FIG. 12 was obtained when the output voltage of the constant voltage source V2 was made equal to 5V.

As seen from FIG. 12, the voltage at which the MOSFET was turned on varied depending on the resistance value of the magnetoresistance element R1. Since the voltage difference ΔVg for turning on the MOSFET was 108 mV, the ratio of the voltage change, or ΔVg/Vg, was found to be equal to 7% to prove that the voltage difference was sufficiently large for turning on/off the MOSFET by changing the resistance value of the magnetoresistance element.

Figure 13:
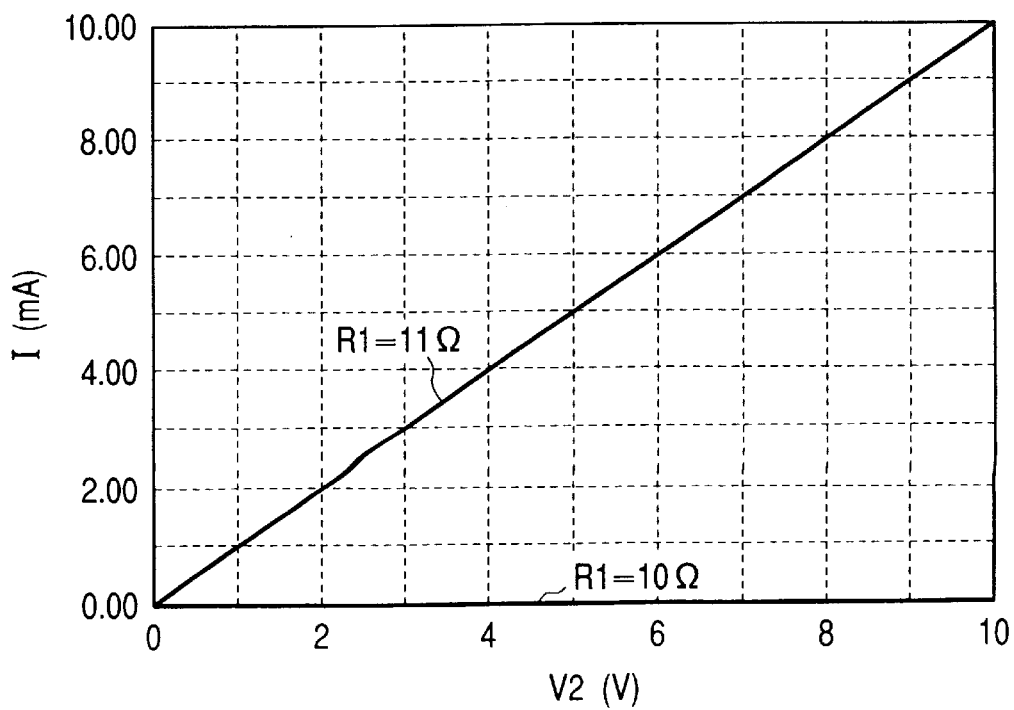
FIG. 13 is a graph showing the relationship between the output voltage of the constant voltage source V2 and the drain current of the hybrid device of FIG. 7.

FIG. 13 is a graph showing the relationship between the output voltage of the constant voltage source V2 and the drain current I of the hybrid device of FIG. 7. Note that the graph of FIG. 13 was obtained when the output voltage of the constant voltage source V1 was made equal to 5V.

As seen from FIG. 13, the drain current I was equal to 0 when the resistance of the magnetoresistance R1 was equal to 10 Ω, whereas the drain current I flowing to the MOSFET M1 was proportional to the output voltage of the constant voltage source V2 when the resistance of the magnetoresistance element R1 was 11Ω.

Figure 14:
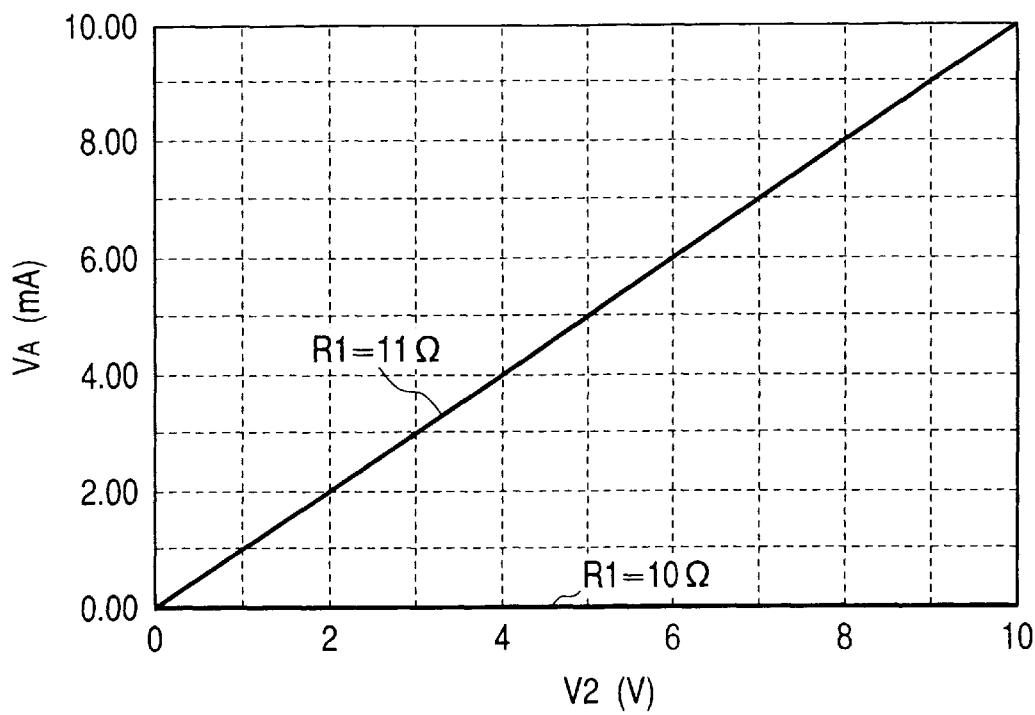
FIG. 14 is a graph showing the relationship of the voltage between the drain electrode and the ground potential relative to the output voltage of the constant voltage source V2 of the hybrid device of FIG. 7.

FIG. 14 is a graph showing the relationship of the voltage between the drain electrode of the MOSFET and the ground potential relative to the output voltage of the constant voltage source V2 of the hybrid device of FIG. 7 that varied as a function of the resistance of the magnetoresistance element.

As seen from FIG. 14, the voltage $V_A$ between the drain electrode (point A) of the MOSFET and the ground potential was 0V when the resistance of the magnetoresistance R1 was equal to 10 Ω, whereas the output voltage of the constant voltage source V2 was output without modification when the resistance of the magnetoresistance element R1 was 11 Ω. Thus, if the output voltage of the voltage source V2 is set to 3V, two different voltage values of 0V and 3V will be output as $V_A$.

Thus, a hybrid device according to the invention can produce output voltages that can be subjected to an analog/digital (A/D) conversion without requiring amplification by means of a sense circuit.

Sixth Embodiment

While not specifically illustrated in the hybrid device of FIG. 9, a wiring resistance can exist between the constant voltage source V1 and the resistor or between the magnetoresistance element and the ground potential and remarkably affect the performance of the hybrid device.

Therefore, resistors Rb and Rc were inserted respectively between the magnetoresistance element Ra and the ground potential and between the resistor Rd (=5 KΩ) and the constant voltage source V1 to see the influence of the wiring resistance. All the resistors Rb, Rc and R3 were made to show a resistance value of 1 KΩ. A MOSFET same as that of the fifth embodiment was used and the magnetoresistance element Ra was of the spin tunnelling type that had a configuration of NiFeCo (50 nm)/Al$_2$O$_3$ (1.2 nm)/Co (30 nm) layers and showed two different resistance values of 4.0 KΩ and 4.8 KΩ (with a ratio of change of resistance=20%). An aluminum made write line was connected to the magnetoresistance element by way of an SiN film and the device was subjected to a binary recording operation in a manner as shown in FIGS. 8A and 8B.

Figure 15:
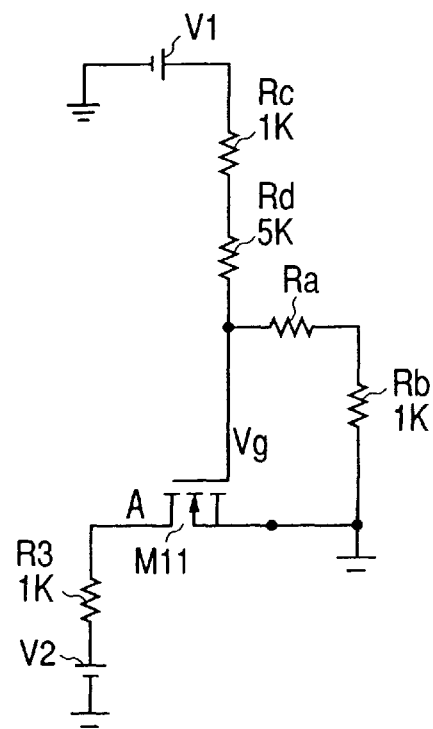
FIG. 15 is a schematic circuit diagram of a circuit for verifying the influence of the wiring resistance of a hybrid device according to the invention.
Figure 16:
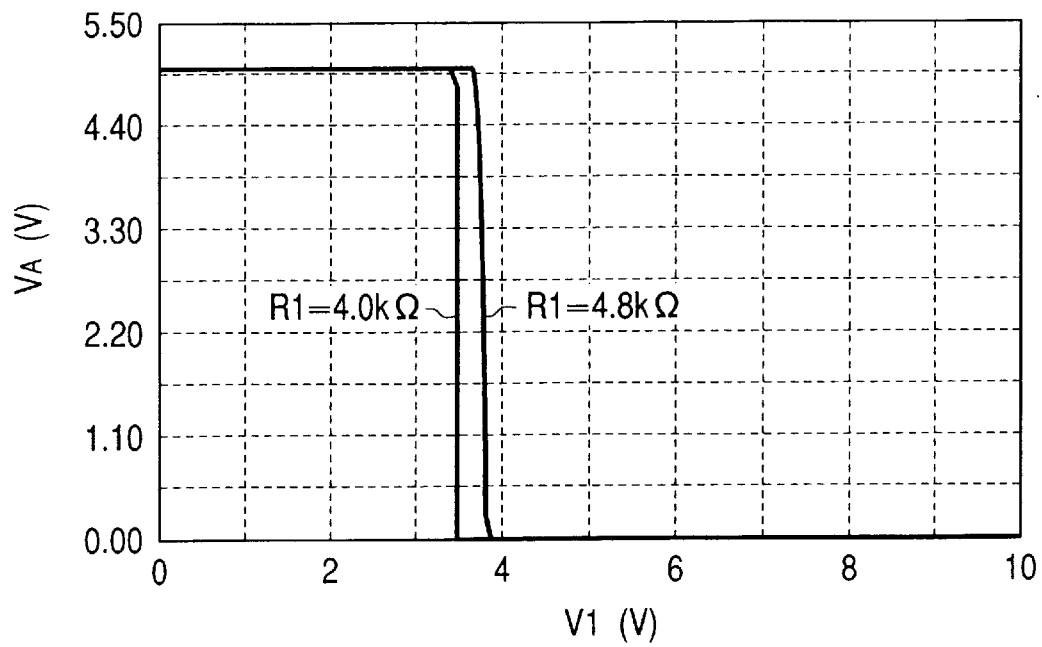
FIG. 16 is a graph showing the relationship of the output voltage of the constant voltage source V1 relative to the voltage between the drain electrode and the ground potential of the hybrid device of FIG. 15.

FIG. 16 is a graph showing the relationship of the voltage between the drain electrode of the MOSFET and the ground potential relative to the output voltage of the constant voltage source V1 of the hybrid device of FIG. 15. Note that the graph of FIG. 16 was obtained when the output voltage of the constant voltage source V2 was made constantly equal to 5V.

As seen from FIG. 16, the potential $V_A$ of the drain electrode was 5V when the output voltage of the constant voltage source V1 was low, whereas $V_A$ fell to 0V when the output voltage of the constant voltage source V1 raised. The threshold level of the voltage change shows a difference of about 400mV between when R1=4.8 KΩ and when R1=4.0 KΩ to prove that the voltage difference was sufficiently large for turning on/off the MOSFET by changing the resistance value of the magnetoresistance element.

Figure 17:
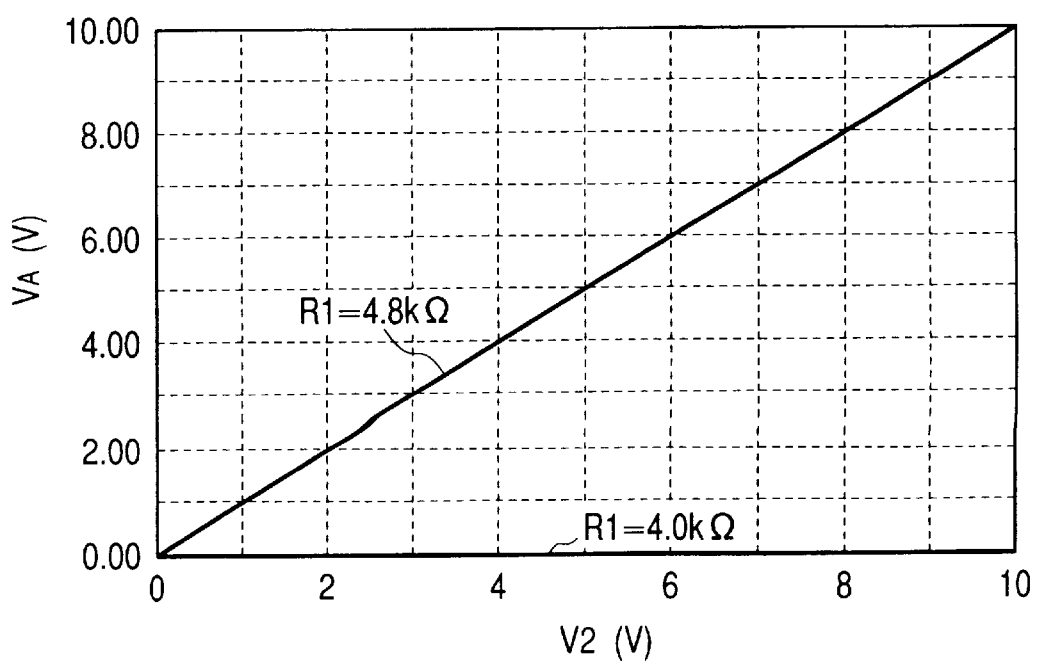
FIG. 17 is a graph showing the relationship of the output voltage of the constant voltage source V2 relative to the voltage between the drain electrode and the ground potential of the hybrid device of FIG. 15.
Figure 18:
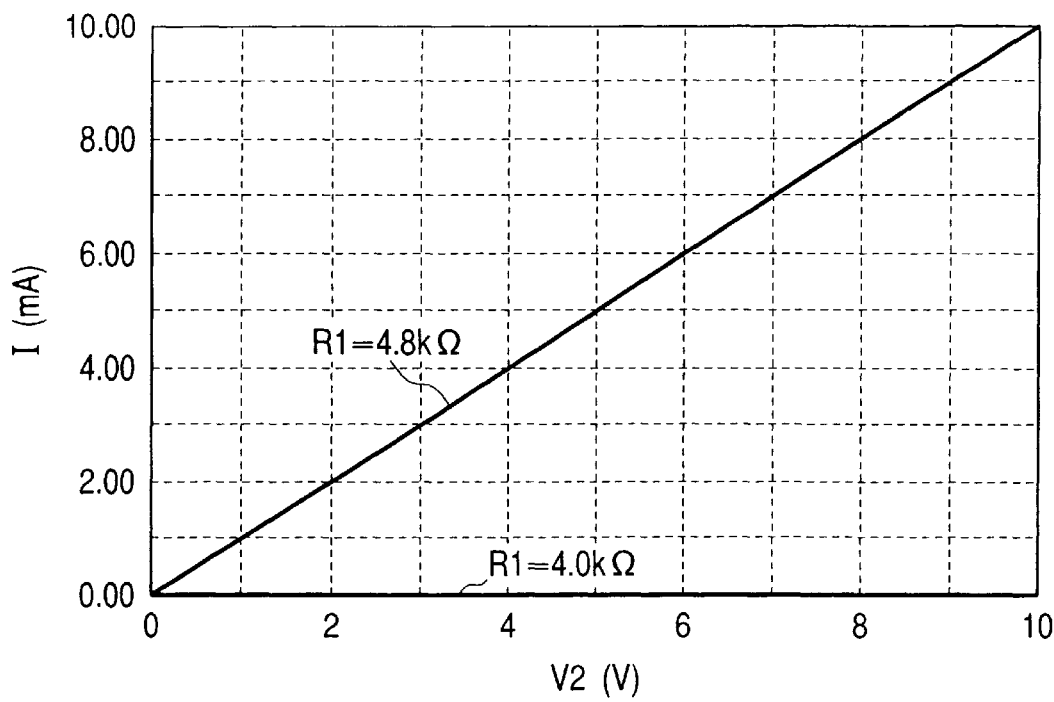
FIG. 18 is a graph showing the relationship between the output voltage of the constant voltage source V2 and the drain current of the hybrid device of FIG. 15.

FIG. 17 is a graph showing the relationship of the voltage between the drain electrode of the MOSFET and the ground potential relative to the output voltage of the constant voltage source V2 of the hybrid device of FIG. 15. FIG. 18 is a graph showing the relationship between the output voltage of the constant voltage source V2 and the drain current of the hybrid device of FIG. 15. Note that the graphs of FIGS. 17 and 18 were obtained when the output voltage of the constant voltage source V1 was made constantly equal to 3.7V.

As seen from FIGS. 17 and 18, by selecting for the output voltage of the constant voltage source V1 an intermediary voltage (=3.7V) between the two threshold voltages (for turning on the MOSFET of FIG. 9) that are determined by the resistance values of the magnetoresistance element, $V_A$ is made to increase with the output voltage of the constant voltage source V2 when R1=4.8 KΩ but held to 0V regardless of the output voltage of the constant voltage source V2 when R1=4.0 KΩ.

Thus, by constantly holding an output voltage value of 3V for the constant voltage source V2, binary outputs of 0V and 3V can be obtained for $V_A$ to produce output voltages that can be subjected to an analog/digital (A/D) conversion without requiring amplification by means of a sense circuit.

Seventh Embodiment

Figure 19:
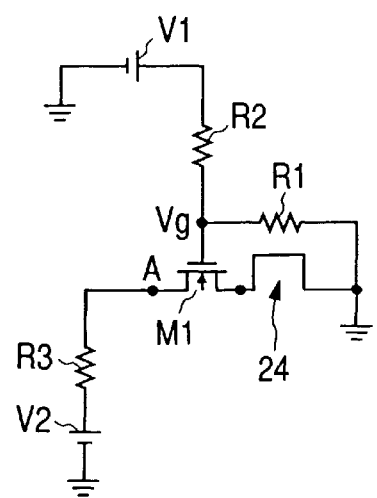
FIG. 19 is a schematic circuit diagram of a seventh embodiment of hybrid device according to the invention.

FIG. 19 is a schematic circuit diagram of a seventh embodiment of the invention which is a hybrid device (magnetic thin film/semiconductor hybrid device). This embodiment has a configuration basically same as that of the first embodiment and hence the components same as those of FIG. 7 are denoted respectively by the same reference symbols in FIG. 19. In this embodiment, the current path for the drain current of the field effect transistor M1 is arranged close to the magnetoresistance element R1 and operates as write line 24 to make the device different from that of the first embodiment.

Referring to FIG. 19, the magnetoresistance element R1 operates for storing information. The magnetoresistance element R1 is typically made of AMR film or GMR film and shows a resistance value that varies depending on its state of magnetization. A magnetoresistance element made of AMR film shows a resistance that varies depending on the angle between the direction of the electric current flowing through the magnetic film of NiFe, Co or the like and the direction of magnetization. A magnetoresistance element made of GMR film has a configuration of sandwiching a non-magnetic film by means of a pair of magnetic films showing different coercive forces and shows a resistance that varies depending on the relative angle between the directions of magnetization of the two magnetic films.

In FIG. 19, R2 is a resistor. Unlike the magnetoresistance element R1, the resistor R2 has a constant resistance value. The magnetoresistance element R1 and the resistor R2 are connected in series and the intermediate connection point thereof is connected to the gate electrode of a metal/oxide/semiconductor type field effect transistor (MOSFET) M1. The other end of the magnetoresistance element R1 is typically grounded (ground potential) and the other end of the resistor R2 is typically connected to a power source V1.

Figure 1:
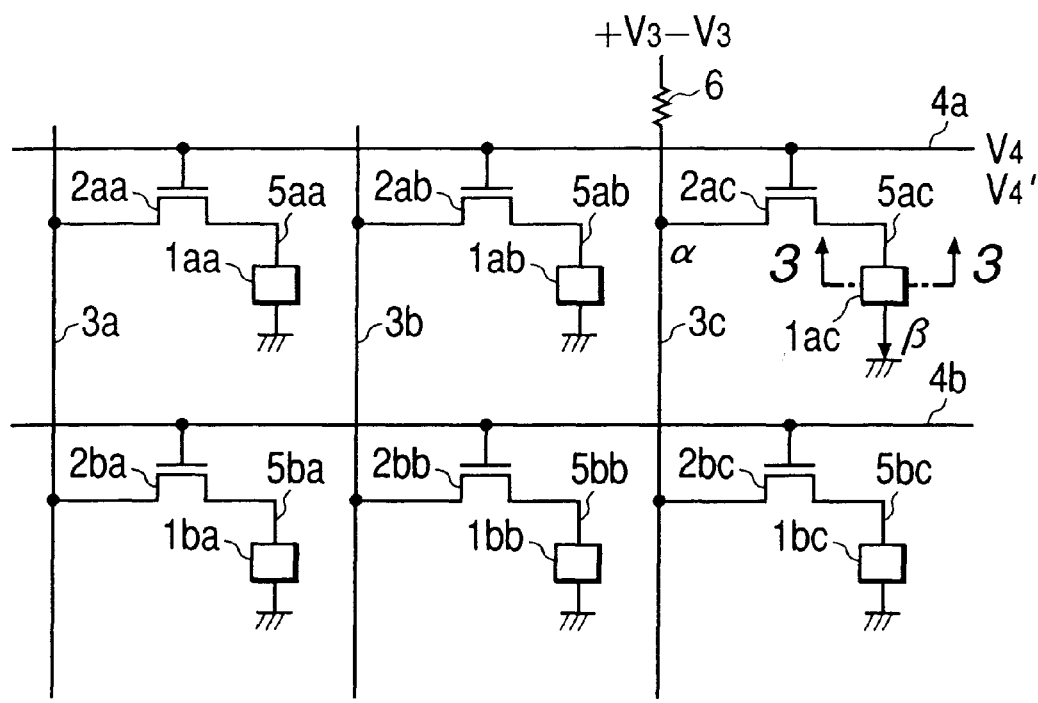
FIG. 1 is a schematic circuit diagram of a known memory apparatus comprising known memory devices.
Figure 2A:
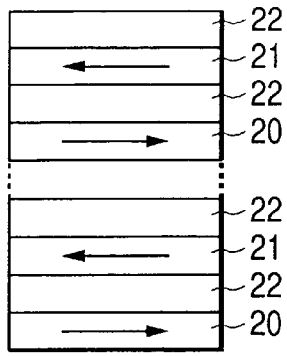
FIGS. 2A and 2B are schematic illustrations of the configuration of a magnetoresistance element that can be used for a known memory device.
Figure 2B:
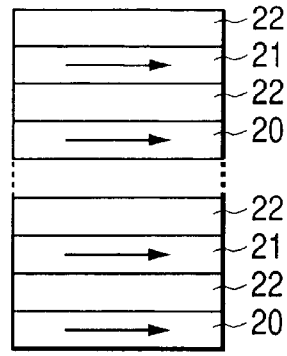
Figure 3A:
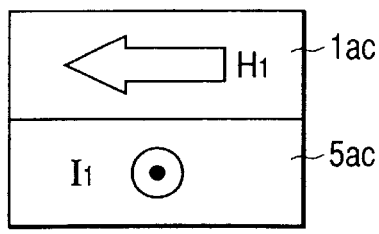
FIGS. 3A and 3B are schematic illustrations of an operation of writing information in a known memory device.
Figure 3B:
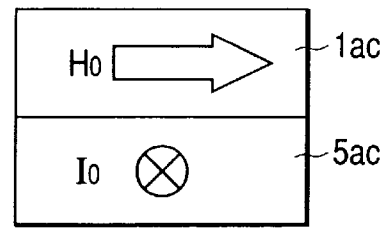
Figure 4:
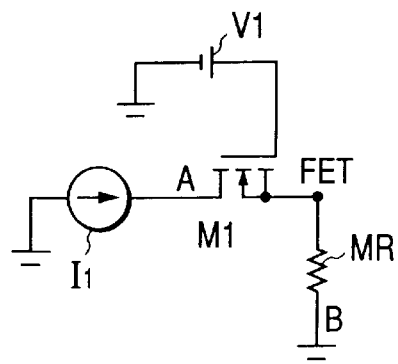
FIG. 4 is a schematic circuit diagram of a memory cell comprising a known memory device.
Figure 5:
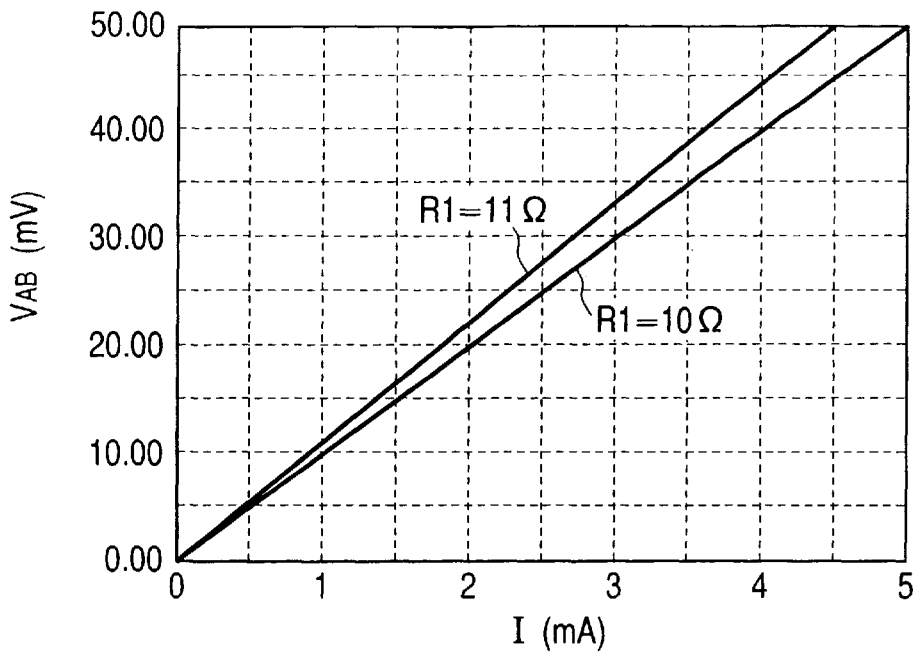
FIGS. 5 and 6 are graphs showing the current-voltage characteristics of the memory cell of FIG. 4 observed in an experiment.
Figure 6:
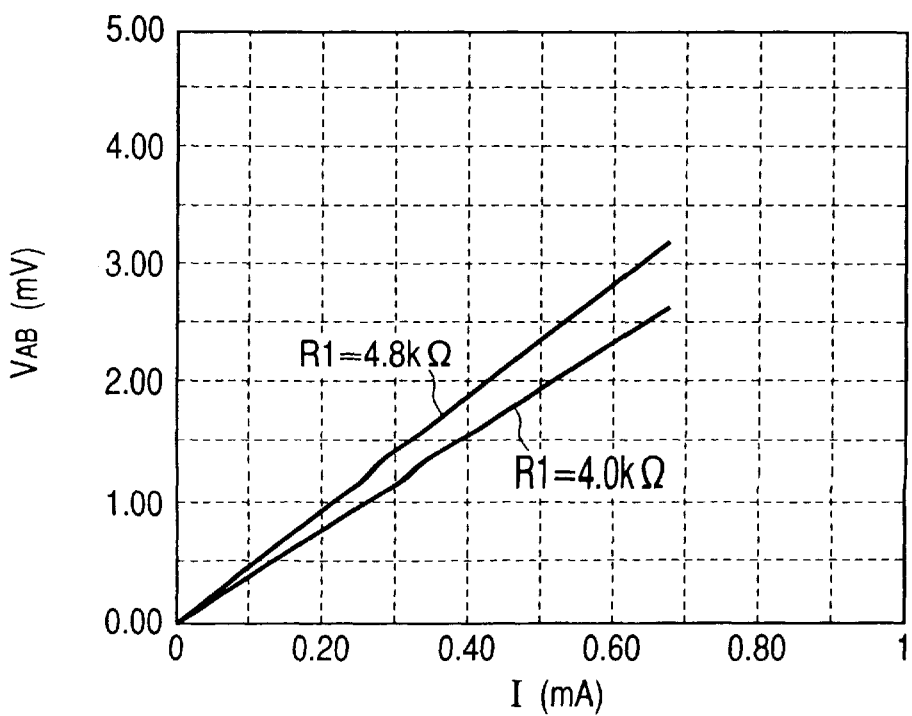

Then, a gate potential Vg expressed by formula (5) below is applied to the gate electrode of the MOSFET M1 of FIG. 1:

$$Vg=(r1/(r1+r2)) \cdot V1 \quad (5)$$

where r1 is the resistance value of the magnetoresistance element, r2 is the resistance value of the resistor and V1 is the voltage of the power source V1. The resistance value of the magnetoresistance element takes either of two different values r1min, r1max (r1min<r1max) depending on its state of magnetization. Then, the gate potential Vg takes either of two different values Vg1, Vg2 defined respectively by formulas (6) and (7) below:

$$Vg1=(r1min/(r1min+r2)) \cdot V1 \quad (6)$$

$$Vg2=(r2max/(r2max+r2)) \cdot V1 \quad (7)$$

The threshold voltage Vth of the gate electrode of the MOSFET M1 is found between Vg1 and Vg2 and the relationship of Vg1, Vg2 and Vth is expressed by formula (8) below.

$$Vg1<Vth<Vg2 \quad (8)$$

It will be clear from formulas (5), (6), (7) and (8) above, the gate potential of the MOSFET M1 is expressed by formula (6) when the resistance value of the magnetoresistance element R1 is equal to r1min. Then, since the gate potential Vg1 is lower than the threshold value Vth of the gate electrode of the MOSFET M1, the MOSFET M1 is turned off and no electric current flows between the source and the drain of the transistor. On the other hand, the gate potential of the MOSFET M1 is expressed by formula (7) when the resistance value of the magnetoresistance element R1 is equal to r1max. Then, since the gate potential Vg2 is higher than the threshold value Vth of the gate electrode of the MOSFET M1, the MOSFET M1 is turned on and an electric current flows between the source and the drain of the transistor. The difference can be detected by connecting a power source V2 to the drain electrode of the MOSFET M1 by way of an resistor R3 and observing the voltage between point A and the ground potential as shown in FIG. 19. It can also be detected by observing the drain current of the MOSFET.

Thus, with the above described embodiment, the information stored in the magnetoresistance element R1 can be detected by detecting the difference between a condition where the drain current flows to the MOSFET M1 and a condition where the drain current does not flow to the MOSFET M1, which will be switched depending on the state of magnetization of the magnetoresistance R1. With this arrangement, the sensitivity of detecting the stored information can be dramatically improved. In short, since the resistance of the magnetoresistance element R1 varies depending on its state of magnetization and the difference of resistance is amplified by the MOSFET M1, it is possible to realize a solid-state memory from which the stored information can be highly sensitively retrieved regardless of the difference of resistance ΔR.

It should be noted that the above described effect of the embodiment is not limited to the circuit configuration of FIG. 19. For instance, the MOSFET may be repalced by a junction type field effect transistor (JFET), a MES (metal semiconductor) type field effect transistor (MESFET), or a MIS (metal insulator semiconductor) type field effect transistor (MISFET) comprising an insulator other than oxide film, although the use of a MOSFET is most desirable from the viewpoint of fine processability and stable controllability. The other end of the magnetoresistance element R1 may be connected to the constant voltage source instead of the ground potential. While R1 is a magnetoresistance element and R2 is a resistor in the embodiment of FIG. 19, they are interchangeable to make R1 a resistor and R2 a magnetoresistance element. The constant voltage sources V1 and V2 may be arranged externally relative to the hybrid device.

While a constant voltage source is connected to the drain electrode of the MOSFET M1 of the embodiment of FIG. 19 to make the intensity of the drain current vary and the difference in the drain current is detected by way of the electric potential of the drain electrode in order to detect the level of the resistance of the magnetoresistance element, the present invention is by no means limited thereto and a sense circuit may be used to amplify the drain current or the drain electrode potential may be observed by connecting a constant current source to the drain electrode for the purpose of the invention.

While the current path of the drain current of the field effect transistor of the above embodiment is made to operates as write line 24 as described above, the underlying principle of writing information is same as that of the first embodiment described earlier by referring to FIGS. 8A and 8B.

Figure 20:
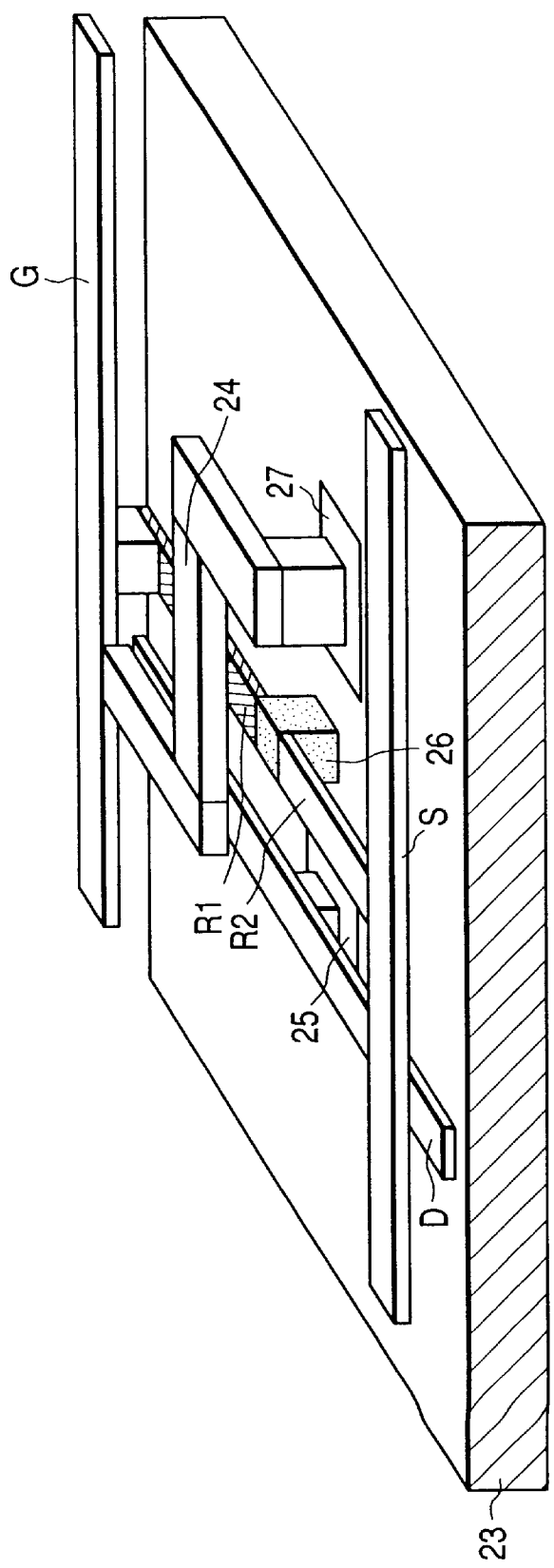
FIG. 20 is a schematic perspective view of a possible specific configuration of the hybrid device of FIG. 19.

FIG. 20 is a schematic perspective view of a possible specific configuration of the hybrid device of FIG. 19. Referring to FIG. 20, the MOSFET M1 comprises a p-type semiconductor Si substrate 23, a drain region 25 and a source region 27 each consisting of an n-type semiconductor region with a gate electrode 26 arranged between the drain region 25 and the source region 27. A resistor R2 and a magnetoresistance element R1 are connected to the gate electrode 26. The other end of the resistor R2 is connected to selection line S, while the other end of the magnetoresistance element R1 is connected to grounding electrode line G. A write line 24 is connected at an end thereof to the source region by way of a source electrode and at the other end to the grounding electrode line G. The write line 24 is arranged close to the top of the magnetoresistance element R1. The drain region is connected to a data line D by way of a drain electrode. Although not shown, the selection line and the data line are connected respectively to power source V1 and power source V2.

For recording information in the above hybrid device, the MOSFET M1 is turned on regardless of the state of magnetization of the magnetoresistance element R1. For this purpose, voltage V1 will be set to a level higher than the level that is used for reproducing the stored information so that the gate potential Vg may be constantly held to a level higher than the threshold voltage Vth of the MOSFET M1. As the drain current is fed to the MOSFET M1 from the power source V2, the drain current flows to the write line 24 and the magnetic field generated by the write line is applied to the magnetoresistance element R1. The magnetoresistance element R1 is magnetized along the longitudinal direction and hence the magnetic field generated by the write line 24 is applied to the magnetoresistance element R1 along the direction of magnetization thereof.

The direction of magnetization can be switched simply by changing the direction of the drain current. The direction of the drain current can be shifted by reducing the potential of the power source V2 to a negative level or by causing the grounding electrode line G connected to the write line 24 to show a positive potential so that an electric current may flow from the source to the drain. The source region and the drain region of the MOSFET M1 are preferably arranged symmetrically relative to each other so that the device may show same current/voltage characteristics when the drain current is reversed. The intensity of the recording electric current should be greater than that of the detection current to be used for reproducing the stored information in order to generate a magnetic field. For this purpose, the absolute value of the voltage V2 is set to be higher than that for reproduction. Alternatively, a constant current circuit may be connected to the drain electrode of the MOSFET M1 so that an electric current may flow with such an intensity that meets the level of intensity required for recording information.

With the above arrangement, the device shows a simplified configuration because no additional wire has to be arranged for the write current. Additionally, since the write current flows independently for each bit, the risk of erroneously storing information in an adjacent hybrid device is totally eliminated to ensure a stable and reliable recording operation.

The information stored in the magnetoresistance element in this way can be read out with an enhanced level of sensitivity because the resistance accurately reflects the recorded information. Additionally, since the voltage of the constant voltage source V2 is directly output, the circuit does not require the use of a sense circuit for amplification. The net result will be a simple circuit configuration, a reduced cost and an increased memory capacity per chip leading to a higher degree of integration. Additionally, once the magnetic film of the magnetoresistance element is magnetized, it maintains the orientation of magnetization. Therefore, a magnetic thin film hybrid device can be used as non-volatile memory device.

While the magnetoresistance element of the above embodiment has a memory layer/pin layer configuration, it may alternatively be made to have a detection layer/memory layer configuration, the layer having a smaller coercive force operating as detection layer while a layer having a greater coercive force operating as memory layer. In this instance, information is recorded in the memory layer and the recorded information is read out by producing parallel and anti-parallel magnetization states by reversing the magnetization of the detection layer to detect resistance change.

The write line and the magnetoresistance element are separated by a distance preferably between 0.005 $\mu$m and 0.2 $\mu$m, more preferably between 0.01 $\mu$m and 0.1 $\mu$m from the viewpoint of the most closely located end faces thereof. If the distance separating the write line and the magnetoresistance element is too small, they can become short-circuited. If, on the other hand, the distance separating them is too large, it is no longer possible for the write line to apply a magnetic field to the magnetoresistance element. The write line has a cross section with a height 0.5 to 5 times, preferably between 1 to 3 times, greater than the width thereof. If the cross section of the write line is too flat, it will not be able to generate a magnetic field with a sufficient intensity level. If, on the other hand, the cross section of the write line is too thin, it can be prepared only with difficulty. While both the magnetoresistance element R1 and the write line 24 are grounded at an end thereof in FIGS. 19 and 20, they may alternatively be connected to a power source.

Eighth Embodiment

Figure 21:
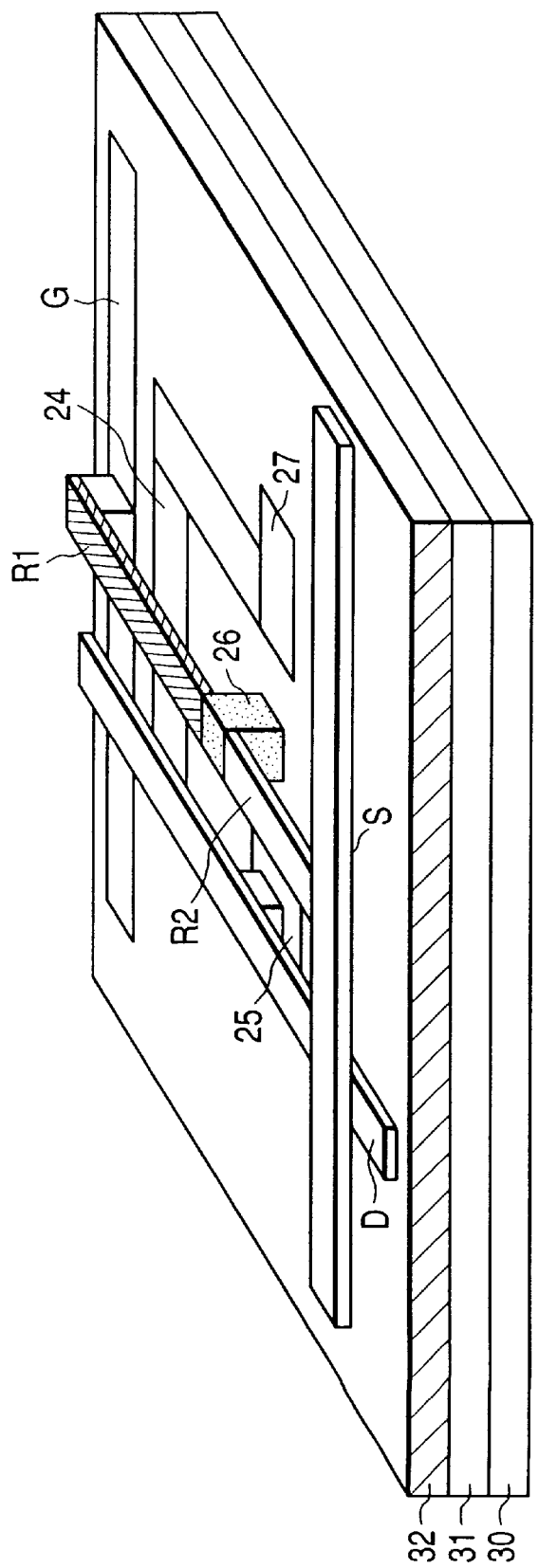
FIG. 21 is a schematic perspective view of another possible specific configuration of the hybrid device of FIG. 19.

Now, an eighth embodiment of the invention will be described by referring to FIG. 21. The hybrid device of this embodiment is formed on a so-called SOI (silicon on insulator) substrate comprising a substrate layer 30 and an Si epitaxial layer 32 arranged on the substrate 30 with an insulation layer 31 interposed therebetween. An SOI substrate provides a number of advantages that can not be obtained by a bulk substrate that is used for preparing an ordinary Si integrated circuit. The advantages include (1) easiness of dielectric separation required for an enhanced degree of integration, (2) an excellent durability referring to radiations, (3) a reduced level of stray capacity for ensuring a high speed operation of the device, (4) omission of the well forming process, (5) prevention of the latch-up phenomenon and (6) adaptability for preparing full-depletion type field effect transistors due to the thin film nature.

A hybrid device as shown in FIG. 20 may be arranged on the SOI substrate. Alternatively, the wires of the device may be buried in the Si epitaxial layer. For instance, wires including the write line 24 extending from the source region to the grounding line G may be buried in the Si epitaxial layer by producing a highly conductive region in the layer by means of doping as shown in FIG. 21. Additionally, the grounding line G may also be arranged in the Si epitaxial layer as shown in FIG. 21. Preferably, an insulator region is arranged around the highly conductive region produced in the Si epitaxial layer in order to insulate it from the surrounding Si epitaxial layer.

When the write line is arranged in the epitaxial layer of the SOI substrate, it is no longer necessary to preparing the write line on the substrate so that the overall process for manufacturing the hybrid device can be simplified. Since a highly flat Si epitaxial layer can be produced in an SOI substrate, it is possible to reliably control the distance between the magnetoresistance film formed on the Si epitaxial layer and the write line. In view of the fact that the distance separating the write line and the magnetoresistance film significantly affects the magnitude of the magnetic field applied to the magnetoresistance film, it will be possible to produce highly integrated circuit devices with a lower percent defective by using the technique of burying the write line in the epitaxial layer of an SOI substrate.

Figure 22:
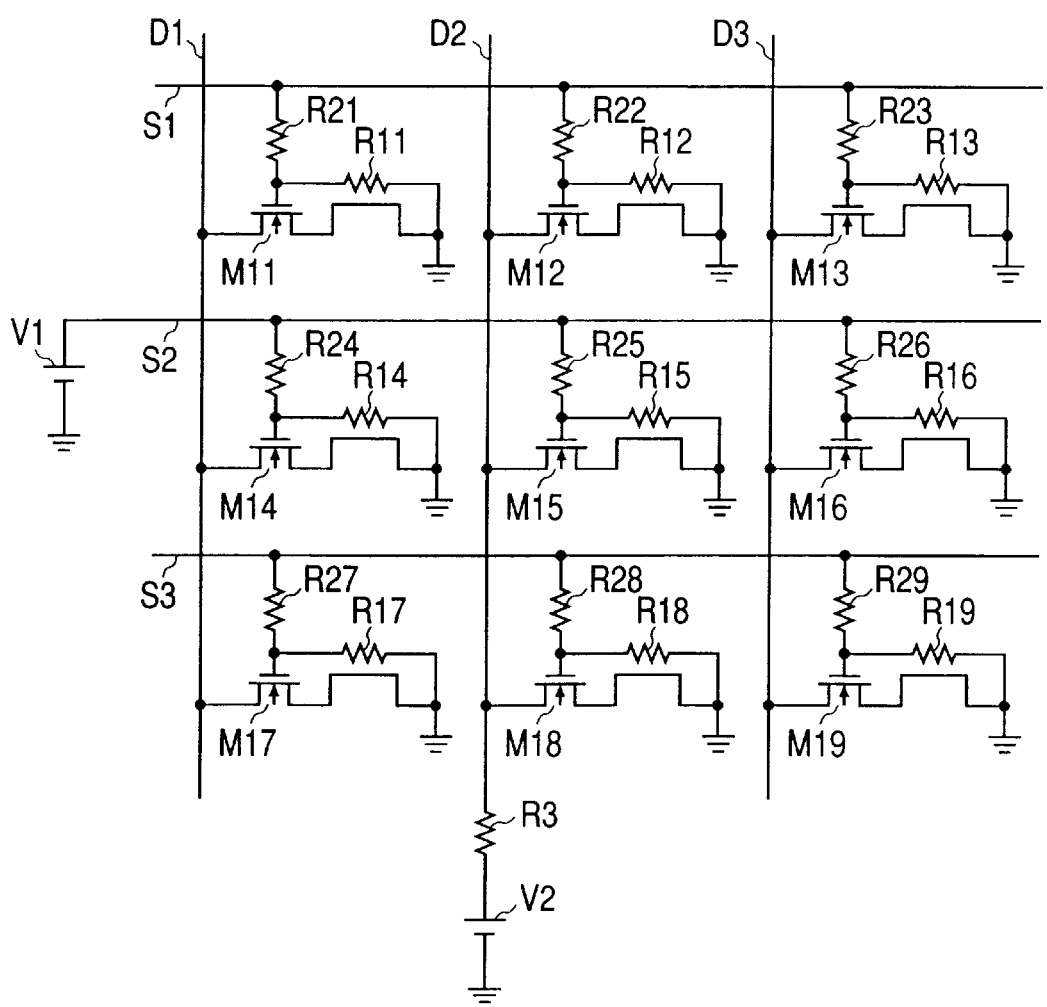
FIG. 22 is a schematic circuit diagram of a memory apparatus according to the invention and comprising a large number of hybrid devices having a configuration as shown in FIG. 19.

FIG. 22 is a schematic circuit diagram of a memory apparatus according to the invention and comprising a large number of hybrid devices having a configuration as shown in FIG. 19 as solid-state memory cells. In the apparatus of FIG. 22, the hybrid devices are arranged to form a matrix. In FIG. 22, there are shown magnetoresistance elements R11, R12, R13, R14, R15, R16, R17, R18 and R19, resistors R21, R22, R23, R24, R25, R26, R27, R28 and R29 and MOSFETs M11, M12, M13, M14, M15, M16, M17, M18 and M19. In FIG. 22, S1, S2 and S3 are selection lines, whereas D1, D2 and D3 are data lines.

When reading the information stored in a specific one of the hybrid devices, e.g. the magnetoresistance element R15, the constant voltage sources V1 and V2 are connected respectively to the selection line S2 and the data line D2 corresponding to the hybrid device of the magnetoresistance element R15 by means of respective switching circuits (not shown). Then, no magnetoresistance elements other than the magnetoresistance element R15 will be selected not detected so that only the information stored in the magnetoresistance element R15 can be read. In this way, each of the MOSFETs can be used to amplify a signal representing a resistance value and also select a specific device out of the large number of devices.

When, on the other hand, recording information in a specific one of the large number of hybrid devices, e.g., the magnetoresistance element R15, a high voltage is applied to the gate electrode of the MOSFET M15 in order to turn on the MOSFET M15. Then, a drain current is made to flow from the power source V2 to the MOSFET M15 so that the information is recorded by means of the magnetic field generated by the write line 24. Then, no drain current will flow to any of the MOSFETs other than the MOSFET M15 so that information can be recorded reliably only in the magnetoresistance element R15. As in the case of reproducing information, each of the MOSFETs can be used to select a specific device out of the large number of devices to which the recording current is made to flow without requiring the use of a dedicated device. The net effect will be a memory apparatus having a simplified circuit configuration.

The above described seventh embodiment of hybrid device comprises a magnetoresistance element that may be a spin scattering type magnetoresistance element or a spin tunnelling type magnetoresistance element as described earlier by referring to the fourth embodiment. The materials of the first and second magnetic layers and the non-magnetic layer as described earlier by referring to the fourth embodiment can also be used for the seventh embodiment.

Finally, it should be noted that any type of resistor can be used for the hybrid device of the present invention so long as it has a constant resistance value. For example, a field effect transistor can be used as a resistor by connecting the gate electrode with the drain electrode to form one terminal and using the source electrode as the other terminal of a resistor device. Alternatively, a magnetoresistance element having a constant resistance can be used as a resistor separately from the magnetoresistance device exhibiting a memory function.

What is claimed is:

1. A hybrid device comprising:
   a magnetoresistance element;
   a resistor connected in series to an end of said magnetoresistance element; and
   a field effect transistor having its gate electrode connected to a connection point of said magnetoresistance element and said resistor.

2. A hybrid device according to claim 1, wherein said magnetoresistance element has a first magnetic layer with a small coercive force, a non-magnetic layer, and a second magnetic layer with a coercive force greater than that of the first magnetic layer, said layers being laid sequentially one on the other.

3. A hybrid device according to claim 1, further comprising:
   a write line for writing information to said magnetoresistance element.

4. A hybrid device according to claim 3, wherein
   the current path of the drain current of said field effect transistor is arranged close the the magnetoresistance element and operates as the write line.

5. A hybrid device according to claim 1, wherein said resistor comprises a second field effect transistor.

6. A hybrid device according to claim 1, wherein said resistor comprises a second magnetoresistance element.

7. A memory apparatus comprising:
   the hybrid device according to any of claims 1 through 6;
   a first voltage source for applying a predetermined voltage to the magnetoresistance element by way of the resistor; and
   a second voltage source for applying a constant voltage between the source electrode and the drain electrode of said field effect transistor.

8. A memory apparatus according to claim 7, further comprising:
   a resistor connected between the source electrode of said field effect transistor and the second voltage source.

9. A memory apparatus comprising:
   the hybrid device according to any of claims 1 through 6;
   a voltage source for applying a predetermined voltage to the magnetoresistance element by way of the resistor; and
   a current source for flowing a constant electric current between the source electrode and the drain electrode of said field effect transistor.

10. A memory apparatus comprising:
    a plurality of hybrid devices according to any of claims 1 through 6 and arranged to form a matrix;
    a plurality of selection lines, each connecting the resistors of the hybrid devices of a same row;
    a first voltage source for selectively applying a predetermined voltage to the magnetoresistance element of a desired hybrid device by way of the related selection line;
    a plurality of data lines, each connecting the source electrodes of the field effect transistors of the hybrid devices of a same column for reading information from a desired hybrid device; and
    a second voltage source for selectively applying a voltage to the field effect transistor of the desired hybrid device by way of the related data line.

11. A method for reading the information stored in a hybrid device of the memory apparatus according to claim 10, said method comprising steps of:
    selectively applying a constant voltage to the selection line connected to the resistor of the specific hybrid device by means of said first voltage source;
    selectively applying a constant voltage to the data line connected to the source electrode of the field effect transistor of the hybrid device by means of said second voltage source; and
    reading the information stored in the hybrid device by detecting the on/off state of the field effect transistor of the hybrid device by way of the data line subjected to said voltage.

* * * * *